United States Patent [19]
Park et al.

[11] Patent Number: 6,080,931
[45] Date of Patent: Jun. 27, 2000

[54] SEMICONDUCTOR PACKAGE

[75] Inventors: Kyei Chan Park, Suwon; Kil-Sub Roh, Seoul, both of Rep. of Korea

[73] Assignee: Hyundai Electronics Industries Co., Ltd., Kyoungki-do, Rep. of Korea

[21] Appl. No.: 08/812,655

[22] Filed: Mar. 6, 1997

[30] Foreign Application Priority Data

Mar. 6, 1996 [KR] Rep. of Korea .................. 96-5798

[51] Int. Cl.⁷ ..................................................... H01L 23/02
[52] U.S. Cl. ........................... 174/52.4; 257/723; 257/693
[58] Field of Search ..................................... 257/723, 724, 257/725, 685, 777, 686, 693; 361/718, 723; 174/52.2, 52.4

[56] References Cited

U.S. PATENT DOCUMENTS

| | | | |
|---|---|---|---|
| 5,331,235 | 7/1994 | Chun ........................................ | 257/777 |
| 5,438,224 | 8/1995 | Papageorge et al. ..................... | 257/777 |
| 5,468,995 | 11/1995 | Higgins, III ............................. | 257/697 |
| 5,477,082 | 12/1995 | Buckley, III et al. .................... | 257/679 |

*Primary Examiner*—Kristine Kincaid
*Assistant Examiner*—Hung V Ngo
*Attorney, Agent, or Firm*—Ware, Fressola, Van Der Sluys & Adolphson LLP

[57] ABSTRACT

A semiconductor package is disclosed, including: (a) two semiconductor chips having a plurality of bonding pads; (b) an insulating circuit film having (i) an insulating base film with a plurality of through holes, (ii) a plurality of first metal lines formed on upper and lower faces of the base film, (iii) a plurality of protruding, conductive inner pads which are respectively formed on the first metal lines, being respectively connected to said bonding pads of each semiconductor chip, (iv) a plurality of protruding, conductive outer pads which are formed on the first metal line at a predetermined interval from the plurality of inner pads, and (v) a plurality of second metal lines formed along wall surface of the plurality of through holes to connect to the inner pads of each semiconductor chip, for electrically connecting inner pads each other which are positioned at the upper and lower surfaces of the base film, (c) a lead frame including an inner lead for connecting the outer pads of the insulating circuit film to an external device so that the semiconductor chips are attached to the insulating circuit film in a manner such that the upper surfaces where the bonding pads are arranged, face each other.

11 Claims, 5 Drawing Sheets

SEMICONDUCTOR PACKAGE

BACKGROUND OF THE INVENTION

1. Field of the Invention

The present invention relates to a semiconductor package, and more particularly, to a multi-chip package which is capable of achieving light, thin and miniaturized packaging, while increasing capacity thereof.

2. Description of Related Art

Generally, in the construction of a plastic semiconductor package, a single semiconductor chip is molded by a resin such as epoxy molding compound, and forms a signal communication system using a lead frame having an outer lead to be mounted on a printed circuit board(PCB).

FIG. 1 is a sectional view showing a conventional semiconductor package.

Referring to FIG. 1, there are provided a semiconductor chip (or die) 1, a lead frame 2 which includes an inner lead 2a, an outer lead 2b, and a paddle 2c, and serves to support the semiconductor chip 1 and concurrently to form an electrical signal transmission path to the outside of chip. A metal wire 3 electrically connects the inner lead 2a of the lead frame 2 to the semiconductor chip 1, and a sealing body 4 seals the semiconductor chip 1, the inner lead 2a of the lead frame 2 and the metal wire 3.

As shown in FIG. 1, the semiconductor chip 1 is fixed to the paddle 2c of the lead frame 2 by means of an adhesive, and its pad electrode is electrically connected with the inner lead 2a of the lead frame 2 through the metal wire 3. A predetermined area including the semiconductor chip 1, the inner lead 2a of the lead frame 2, and the metal wire 3 is sealed by a plastic resin, to thereby form a rectangular type of package body, the sealing body 4. At both sides of the sealing body 4, a plurality of outer leads protruding from the sealing body 4 are separated from one another at predetermined intervals, to be mounted on the printed circuit board.

A manufacturing method of the plastic semiconductor package according to the conventional art includes the steps of: die-bonding the semiconductor chip 1 on the paddle 2c of lead frame 2; wire-bonding the semiconductor chip 1 on the paddle 2c to the inner lead 2a of the lead frame 2 by means of the metal wire 3; sealing the predetermined area including the semiconductor chip 1, the inner lead 2a of the lead frame 2, and the metal wire 3 to thereby form the sealing body 4; cutting dam bars (not shown) which functions to support each lead of the lead frame 2 by a trimming process; and folding the outer lead 2b protruding from the both sides of the sealing body 4 by a forming process. A semiconductor package fabricated through the above-mentioned processes, aligns the outer lead 2b thereof to printed metal line patterns of the board and is mounted by a re-flowing after a soldering, to thereby perform input/output operations of an electrical signal.

In the conventional semiconductor package, however, there is a problem in that the capacity of package is limited because the package body including the chip 1 is very thick, and has a large volume.

Further, there is a problem in that the conventional semiconductor package has a low reliability due to the physical properties of the wire as used in that bonding by the metal wire made of a materials such as an aluminum or gold can easily fail due to an exterior impact.

In addition, in case of a multi-level package where two or more semiconductor chips are installed in a single sealing body, the conventional semiconductor package has a limitation in achieving a light, thin and miniaturized package due to loop height of wire. Meanwhile, in the case where the two chips are facing to each other, there occurs a problem in that a manufacturing process becomes more complicated, the reason being that one chip must use a mirror chip that designes differently than the other chip. Moreover, the conventional semiconductor package suffers from a limited pin configuration due to the construction of the chip itself when the inner lead or multi-chip module for electrical conduction is designed.

SUMMARY OF THE INVENTION

Accordingly, the present invention is directed to a semiconductor package that substantially obviates one or more of the problems due to limitations and disadvantages of the related art.

An object of the invention is to provide a semiconductor package which is capable of achieving light, thin and miniature packaging, while increasing capacity thereof.

To accomplish this and other objects of the present invention, a semiconductor package includes: (a) two or more semiconductor chips having a plurality of bonding pads; (b) an insulating circuit film having (i) an insulating base film with a plurality of through holes, (ii) a plurality of first metal lines formed on upper and lower faces of the base film, (iii) a plurality of protruding, conductive inner pads which are respectively formed on the first metal lines, being respectively connected to said bonding pads of each semiconductor chip, (iv) a plurality of protruding, conductive outer pads which are formed on the first metal line at a predetermined interval from the plurality of inner pads, and (v) a plurality of second metal lines formed along wall surface of the plurality of through holes to connect to the inner pads of each semiconductor chip, for electrically connecting to one another, inner pads which are positioned at the upper and lower surfaces of the base film, (c) a lead frame including an inner lead for connecting the outer pads of the insulating circuit film to an external device, whereby the semiconductor chips are attached to the insulating circuit film in a manner such that the upper surface where the bonding pads are arranged face each other.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings. In the drawings:

FIGS. 7A to 7C are views showing an insulating circuit film in FIG. 6, in which FIG. 7A is a partial sectional view thereof, FIG. 7B is a partial plan view, and FIG. 7C is an enlarged sectional view of a portion including a feed-through hole;

DETAILED DESCRIPTION OF PREFERRED EMBODIMENT

Figure 1:
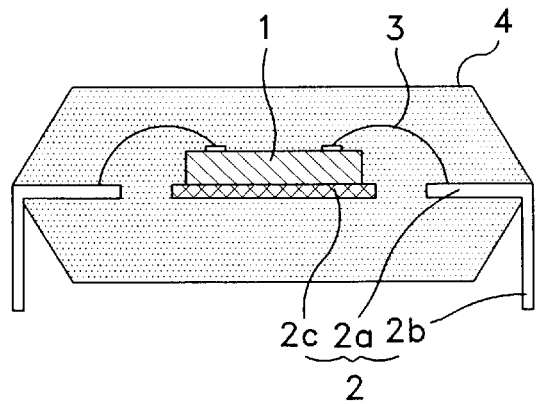
FIG. 1 is a sectional view showing the structure of a conventional semiconductor package.

Reference will now be made in detail to the preferred embodiments of the present invention, examples of which are illustrated in the accompanying drawings.

A semiconductor package according to the present invention has outer leads which are respectively protruded from both sides of a package body, or exposed toward a lower surface of the package body.

An insulating circuit film according to the present invention is comprised of an insulating base film, and signal transmitting elements formed on the upper and lower surfaces of the base film and provided for an electrical conduction, the signal transmitting elements including a plurality of inner pads which are connected to bonding pads of a semiconductor chip and a plurality of outer pads which are connected to the inner lead of a lead frame. Further, a plurality of through holes are formed to connect specific metal lines on the upper and lower surfaces of the base film to each other, thereby connecting the bonding pads of the upper and lower chips to each other.

In the semiconductor package according to the present invention, the inner pads and outer pads on the insulating circuit film are formed so as to protrude at a predetermined height from the surface of the metal line and are electrically connected to the semiconductor chips and the inner lead of the lead frame. Also, the insulating circuit film, the semiconductor chips and the inner lead of the lead frame are attached by means of an anisotropic conductor containing a given particle. Here, the thickness of insulating circuit film is preferably 10–100 μm, and the inner and outer pads are formed at a height of 1–20 μm and a square size of 5 μm×5 μm–200 μm×200 μm. A metal such as Ag, Sn or In having an electrical conductivity of $10^{-8}$ Ω/cm or more covers the inner lead of the lead frame which is connected to the outer pads of the insulating circuit film. The anisotropic conductor includes conductive particles and a resin in liquid and solid states selected from a group including epoxy or transformed epoxy resin; polyester or transformed polymer; acrylic ester or transformed ester; silicon resins; phenoxy resins; polyurethane; polysulfide; cyanoacrylates; polyalexins; and a polymer which is hardened by thermal radiation, ultraviolet radiation, or room temperature. The given particle contained in the anisotropic conductor is 3–15 μm in size, and is comprised of Ag, Ni, In, Sn, indium tin oxide or in any combination of the above. Otherwise, the given particle can be also of a metal having an electrical conductivity of $10^{-8}$ Ω/cm. Meanwhile, the particle may be rectangular, square, triangular, hexahedral, square horn or triangular horn in shape.

In the semiconductor package according to the present invention, one inner pad and a corresponding outer pad are formed on one metal line on the insulating circuit film.

A bump of predetermined height is formed on the bonding pads of the semiconductor chips, the bump electrically connecting the chips to the insulating circuit film. The electrical connection therebetween is made by the anisotropic conductor containing the given particle, and the outer pads of insulating circuit film is bonded into the inner lead of lead frame through thermal-compression.

The bump preferably is formed at a height of 5–20 μm and at a width of 30–200 μm, and is made by compounding all conductive materials such as gold, solder, and conductive polymer. Meanwhile, the metal line constituting the insulating circuit film contains Cu, Ni and Au; Cu, Ni, Cr and Au; or Cu, Ni, Co and Au. The insulating circuit film is formed within 1 mil. In addition, the feed-through hole has a diameter of 10–20 μm, respectively.

Figure 2:
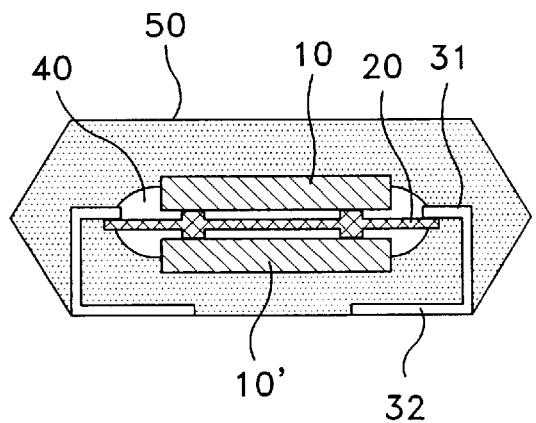
FIG. 2 is a sectional view showing the structure of a semiconductor package according to an embodiment of the present invention.
Figure 3:
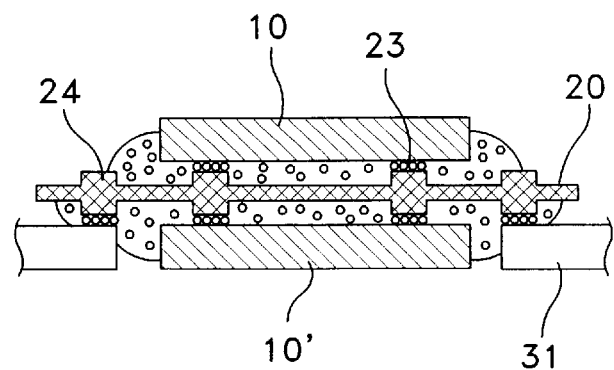
FIG. 3 is a detailed sectional view showing relationship among a semiconductor chip, an insulating circuit film and a lead frame in FIG. 2.
Figure 4A:
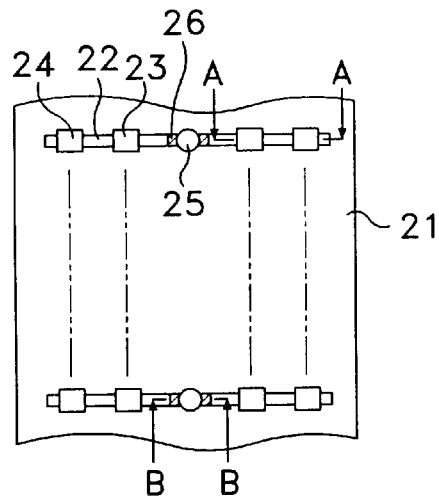
FIG. 4A is a partial plan view of the insulating circuit film in FIG. 3.
Figure 4B:
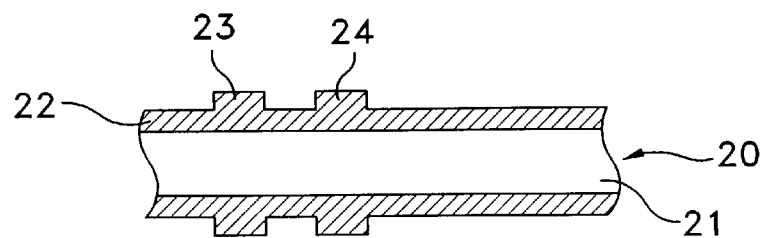
FIG. 4B is a partly sectional view taken along A—A line of FIG. 4A.
Figure 4C:
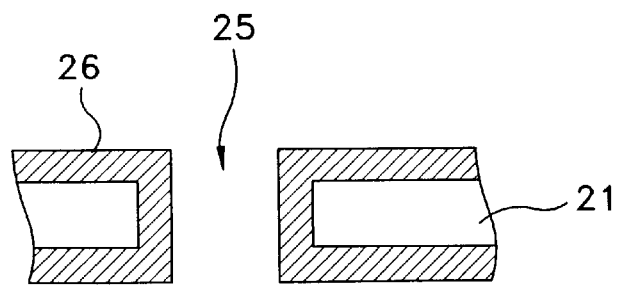
FIG. 4C is an enlarged sectional view taken along B—B line in FIG. 4A.

FIG. 2 is a sectional view showing a construction of a semiconductor package according to an embodiment of the present invention and FIG. 3 is a detailed sectional view showing a connection relationship among the semiconductor chip, the insulating circuit film and the lead frame in FIG. 2. FIGS. 4A to 4C are views showing the insulating circuit film in FIG. 3, wherein: FIG. 4A is a partial plan view of the insulating circuit film used in dual in line package type in FIG. 3; FIG. 4B is a partly sectional view taken along A—A line of FIG. 4A; and FIG. 4C is an enlarged sectional view taken along B—B line in FIG. 4A.

Referring to FIGS. 2 and 3, semiconductor chips 10 and 10' are attached on the upper and lower surfaces of an insulating circuit film 20, to face the upper surfaces, the surfaces where bonding pad electrodes are arranged, of the chips 10 and 10'. A metal line pattern is formed on the insulating circuit film 20 for the purpose of electrical conduction, and an inner lead 31 of the lead frame is connected to both sides of the insulating circuit film 20, to thereby form an electrical connection path to the exterior of the chips 10 and 10'.

The semiconductor chips 10 and 10', the insulating circuit film 20 and the inner lead 31 are bonded by an anisotropic conductor 40, and a predetermined area containing the chips 10 and 10', the insulating circuit film 20 and the inner lead 31 is sealed by a sealing material, to thereby form a package body 50. On the lower surface of the package body 50, there is formed an outer lead 32 which extends from the inner lead 31, being mounted on the substrate (not shown).

To achieve a high degree of reliability in the semiconductor package according to the present invention, the semiconductor chips are directly bonded to the insulating circuit film 20, and the terminals of the insulating circuit film 20 are bonded to the inner 31 leads of the lead frame. In addition, in order to significantly increase the size of chips 10 and 10' occupied in the package body 50 and expand the capacity of the package at least 2 times or more, a conventional paddle of the lead frame is removed and the chips are mounted on both sides of the insulating circuit film 20.

The insulating circuit film 20 is made by using a general flexible circuit board manufacturing method or a design modification thereof, which will be described below with reference to FIGS. 4A to 4C.

Referring to FIGS. 4A to 4C, the insulating circuit film 20 is comprised of a base film 21 and a metal line 22, and has a thickness of 10–200 μm. The metal line 22 is arranged on the upper and lower surfaces of the base film 21, on which Cu, Ni and Au are deposited or plated to a predetermined thickness. Preferably, the thickness of the base film 21 is approximately 25 μm, and the Ni and Au which are sequentially deposited and plated thereon have a thickness of 0.3 μm and 0.1–0.15 μm, respectively.

On the metal line 22, a plurality of inner pads 23 are formed to a predetermined height from the surface of the metal line 22, each of which is connected to the corresponding bonding pads of the semiconductor chips 10 and 10'. A plurality of outer pads 24 are also formed to a predetermined height from the surface of the metal line, each of which is connected to the inner lead of lead frame. The inner pad 23 is seperate from the outer pad by a predetermined interval. Preferably, the protruding height of the inner and outer pads 23 and 24 is within 1–20 μm, the size of the surface thereof ranging from 5 μm×5 μm to 200 μm×200 μm.

In order to connect like terminals of the semiconductor chips 10 and 10' to one another, for example, to connect a CAS (Column Address Strobe) terminal of the chip 10 to a CAS terminal of the chip 10' or to connect a RAS (Row Address Strobe) terminal of the chip 10 to a RAS terminal of the chip 10', a through hole 25 is formed wherein a prescribed conductive metal 26 is formed along both walls thereof, such that it electrically connects the upper and lower chips 10 and 10'. Preferably, the diameter of the through hole 25 is formed to be 10–200 μm. In this embodiment, one through hole 25 is shared by two corresponding inner pads 23 on one side face of the insulating circuit film 20.

Meanwhile, the metal line 22 is comprised of Cu, Ni and Au, but may also be comprised of Cu, Ni, Cr and Au or Cu, Ni, Co and Au. Otherwise, the metal line 22 may also be comprised of a metal having an electrical conductivity of more than $10^{-8}$ Ω/cm.

Referring back to FIG. 2, the anisotropic conductor 40, which is covered to attach the insulating circuit film 20 to the semiconductor chips 10 and 10', the inner lead 31, is a resin in liquid and solid states and contains a given particle for electrical conduction. Examples of the anisotropic conductor 40 are: epoxy or transformed epoxy resin; polyester or transformed polymer; acrylic ester or transformed ester; silicon resins; phenoxy resins; polyurethane; polysulfide; cyanoacrylates; polyalexins; and a polymer which has been hardened by thermal radiation, ultraviolet radiation, or room temperature. The given particle contained in the anisotropic conductor has the size of 3–15 μm, and is comprised of Ag, Au, Ni, In, Sn, indium tin oxide or alloy thereof. Otherwise, the given particle can also be of a metal having an electrical conductivity of more than $10^{-8}$ Ω/cm.

Ag, Sn, In, or a metal having an electrical conductivity of more than $10^{-8}$ Ω/cm covers the inner lead 31 of lead frame connected to the outer pads of the insulating circuit film 20, to thereby improve electrical conductivity.

Hereinafter, a manufacturing method of semiconductor package according to the present invention will be discussed.

First, the insulating circuit film 20 is manufactured in a similar manner to a general printed circuit board. In more detail, Cu is deposited to a predetermined thickness on the upper and lower surfaces of the base film where a plurality of through holes are formed and Ni and Au are afterwards plated to a predetermined thickness. Thereafter, a patterning process is performed to form metal lines, inner pads, and outer pads. Thereafter, a metal plating is performed to form a metal line of connecting an inner pad of an upper chip to an inner pad corresponding thereto through the through holes. Through the above-mentioned steps, the insulating circuit film having the plurality of inner pads and outer pads is completed. At the time, pads on the upper and lower faces of the insulating circuit film which are connected to the bonding pads of chip and to the inner lead of lead frame are formed to a height of about 5 μm.

After the insulating circuit film is placed on the bonding machine, together with the lead frame, the semiconductor chip, the insulating circuit film and the lead frame are bonded by using the anisotropic conductor. At this time, in the case of using a liquid anisotropic conductor, the liquid anisotropic conductor is coated by a dispensing or screen printing method and is then hardened using thermal or ultraviolet radiation. In case of using a solid anisotropic conductor, however, it is bonded using thermal-pressure technique.

After one chip bonding process is completed, the other chip is bonded using the same process.

When the above process has been completed, a semiconductor package is manufactured through molding, trimming and forming processes in the same manner as the general semiconductor package. Afterwards, the semiconductor package is mounted and soldered on the printed circuit board such a manner that the outer lead of lead frame that is protruding or exposed from the package body aligns with the metal lines of the printed circuit board, and finally functions to input/output an electrical signal. Therefore, the semiconductor package according to the present invention is capable of achieving light, thin and miniaturized packaging, while increasing capacity.

In addition, in the semiconductor package according to the present invention, the two semiconductor chips are attached in a face-down manner, using an insulating circuit film in which through holes are formed to achieve electrical conduction between the two chips. As a result, the semiconductor package does not require a mirror chip, and can achieve light, thin and miniaturized packaging, while increasing capacity. Moreover, in the semiconductor package according to the present invention, since the die paddle of existing lead frame and the wire bonding thereof are all replaced by the insulating circuit film, reliability of semiconductor package can be improved, and pin configuration of lead frame can be freely formed. Further, because the two chips are attached in the face-down fashion, an effect due to α-particle generated from the epoxy molding compound can be prevented.

Figure 5:
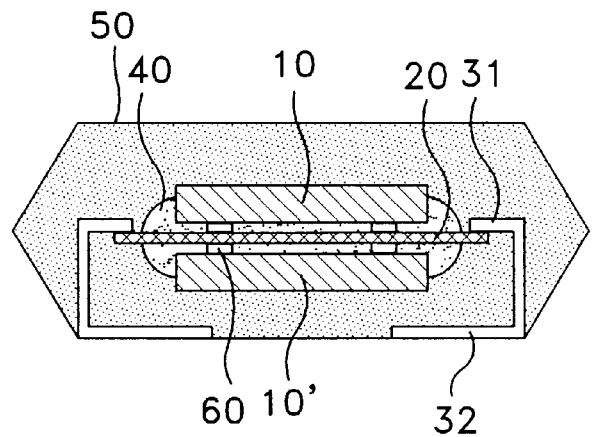
FIG. 5 is a sectional view showing the structure of a semiconductor package according to a second embodiment of the present invention.
Figure 6:
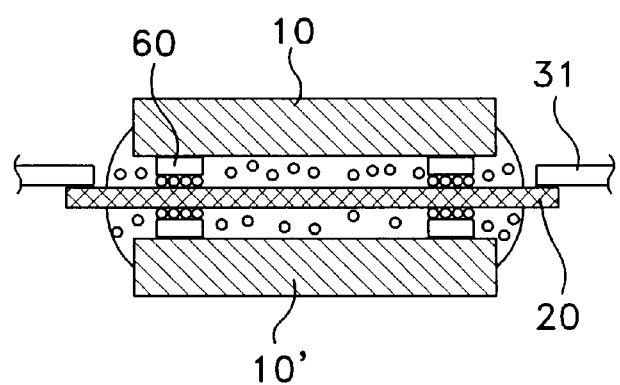
FIG. 6 is a detailed sectional view showing relationship among a semiconductor chip, an insulating circuit film and a lead frame in FIG. 5.
Figure 7A:
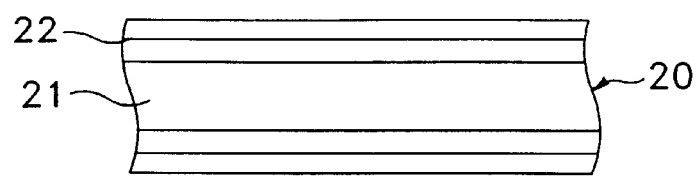
Figure 7B:
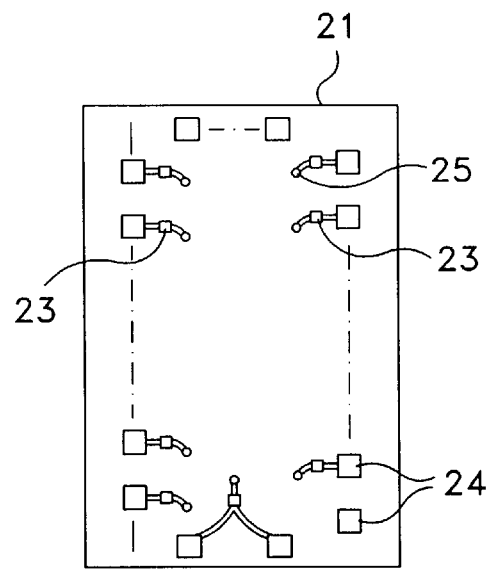
Figure 7C:
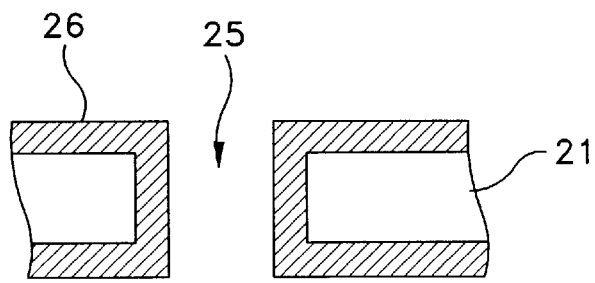

FIG. 5 is a sectional view showing a construction of a semiconductor package according to a second embodiment of the present invention. FIG. 6 is a detailed sectional view showing a connection relationship among a semiconductor chip, an insulating circuit film and a lead frame in FIG. 5. FIGS. 7A to 7C are views showing an insulating circuit film used in quad flat type package type in FIG. 6, wherein FIG. 7A is a partial sectional view, FIG. 7B is a partial plan view, and FIG. 7C is an enlarged sectional view showing a feed-through hole.

Referring to the above drawings, the insulating circuit film 20 is connected to the semiconductor chips 10 and 10' by means of a metal bump 60 which is formed on the bonding pads of chips. The semiconductor chips 10 and 10' and the insulating circuit film 20 are attached to one another by means of the anisotropic conductor 40. The inner lead 31 of the lead frame and the outer pad 24 of the insulating circuit film 20 are bonded without being supported by the anisotropic conductor 40.

In other words, the inner and outer pads 23 and 24 on the metal line 22 of the insulating circuit film 20 are not protruding from the surface of the metal line, and is positioned at the same level as the metal line surface. The metal bump 60 is formed at a predetermined height on the bonding pads of chips, which serves to bond the chips 10 and 10' to the insulating circuit film 20 by means of the anisotropic conductor 40. Meanwhile, the insulating circuit film 20 and the inner lead 31 of lead frame are bonded by a welding method.

Under the above construction, the height of metal bump 60 is 5–20 μm, and the width thereof is 30–200 μm. Main compounding materials of the metal bump 60 can be any metal having electrical conductivity, such as gold, solder or a conductive polymer.

A manufacturing process of the semiconductor package according to this embodiment of the present invention is similar to the first embodiment as mentioned above. After the insulating circuit film has been formed, the outer pads of insulating circuit film 20 are bonded to the inner lead of lead frame in a thermal compression process, and the insulating circuit film is loaded in a bonding machine. Then, the semiconductor chip 10 is bonded to the insulating circuit film 20 using the anisotropic conductor. Thereafter, the other semiconductor chip 10' is bonded through a hardening process, and the semiconductor package as shown in FIG. 5 is finally manufactured through a back-end package assembling process.

Figure 8:
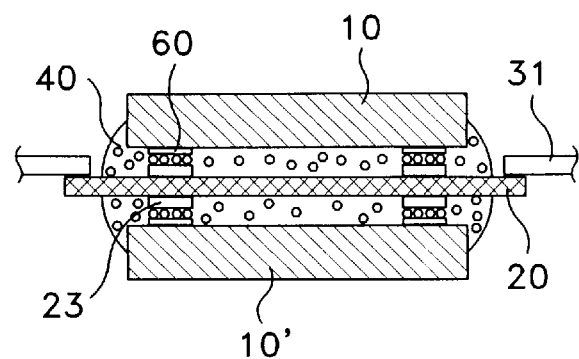
FIG. 8 is a detailed sectional view showing another connection relationship among a semiconductor chip, an insulating circuit film and a lead frame according to a third embodiment of the present invention.

FIG. 8 is a detailed sectional view showing another connection relationship among a semiconductor chip, an insulating circuit film and a lead frame according to a third embodiment of the present invention.

As shown in FIG. 8, the semiconductor chips 10 and 10' includes the metal bump 60 and the insulating circuit film 20 also has a plurality of protruding inner pads 23. A detailed description on the construction and effect thereof will be avoided because the relationship therebetween is the same as the embodiments discussed in the above.

Figure 9A:
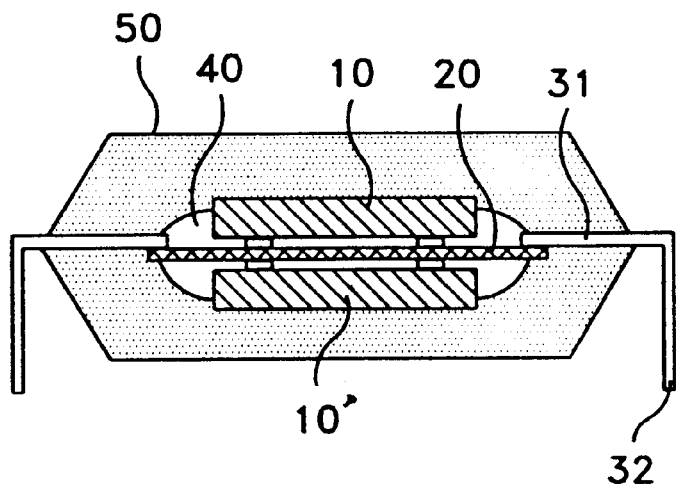
FIGS. 9A and 9B are sectional views respectively showing the structure of semiconductor package according to a fourth embodiment of the present invention.
Figure 9B:
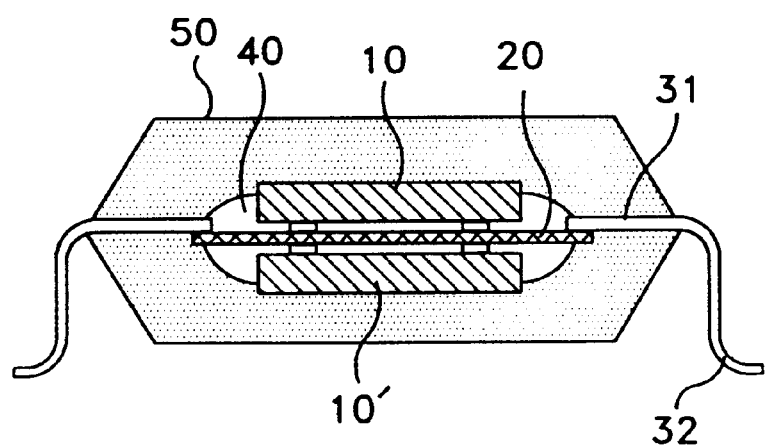

FIGS. 9A and 9B are sectional views respectively showing a construction of semiconductor package according to a fourth embodiment of the present invention. As shown in FIGS. 9A and 9B, out lead 32 of lead frame is exposed from the package body 50 and is then folded in a predetermined shape, in comparison to the outer lead being exposed on the lower surface of the package body as described in the above embodiments. In addition to the above shape as shown in FIG. 9B, meanwhile, the out lead may have various shapes. The construction and effect of this embodiment of the present invention is the same as the embodiments discussed in the above.

It will be apparent to those skilled in the art that various modifications and variations can be made in a semiconductor package of the present invention without departing from the spirit or scope of the invention. Thus, it is intended that the present invention cover the modifications and variations of this invention provided they come within the scope of the appended claims and their equivalents.

What is claimed is:

1. A semiconductor package comprising:
   (a) two semiconductor chips, each semiconductor chip having a front surface on which a plurality of bonding pads are formed, and a rear surface opposite the front surface;
   (b) an insulating circuit film comprising
      (i) an insulating base film with a plurality of through holes,
      (ii) a plurality of metal lines formed on upper and lower faces of said base film, said metal lines respectively formed on said upper and lower faces being connected with each other via the through holes, wherein said upper and lower faces face said front surface of each corresponding semiconductor chip, and
      (iii) means for electrically connecting each of said metal lines with said bonding pads of the corresponding semiconductor chips;
   (c) a plurality of leads electrically connected with said metal lines and extended to connect to an external device wherein said plurality of leads are part of a lead frame, each lead including an inner lead for connecting outer pads to said external device; and
   (d) a package body surrounding a predetermined area containing said semiconductor chips, said insulating circuit film and said inner lead of said lead frame,
   wherein said means for electrically connecting comprises a plurality of protruded, conductive inner pads which are respectively formed on said metal lines, and an anisotropic conductor comprising a resin and conductive particles contained therein, for electrically connecting said inner pads with said bonding pads through said conductor, wherein said metal lines further comprises a plurality of protruded, conductive outer pads which are respectively formed on said metal lines apart by a selected interval from the plurality of inner pads and connected to said plurality of leads, and wherein said plurality of leads include an outer lead exposed at the lower surface of said package body.

2. The semiconductor package as claimed in claim 1, wherein said metal lines are comprised of Cu, Ni, Au; Cu, Ni, Cr, Au; or Cu, Ni, Co, Au and are each formed with a maximum width of 1 mil.

3. The semiconductor package as claimed in claim 1, wherein said through holes have a diameter of 10–200 μm.

4. The semiconductor package as claimed in claim 1, wherein said insulating circuit film, said bonding pads of said semiconductor chips, and said inner leads of said lead frame are electrically connected to one another by means of the anisotropic conductor.

5. The semiconductor package as claimed in claim 4, wherein said insulating circuit film is preferably 10–100 μm in thickness; and said inner and outer pads have a height of 1–20 μm, and a size of 5 μm×5 μm–200 μm×200 μm.

6. The semiconductor package as claimed in claim 4, wherein said resin is in liquid or solid states, and is selected from a group comprising: epoxy or transformed epoxy resin; polyester or transformed polymer; acrylic ester or transformed ester; silicon resins; phenoxy resins; polyurethane; polysulfide; cyanoacrylates; polyalexins; and a polymer which is hardened by thermal radiation, ultraviolet radiation, or room temperature.

7. The semiconductor package as claimed in claim 4, wherein said conductive particles are rectangular, square, triangular, hexahedral, square horn or triangular horn in shape.

8. The semiconductor package as claimed in claim 4, wherein said conductive particles of said anisotropic conductor have a size of 3–15 μm.

9. The semiconductor package as claimed in claim 8, wherein said conductive particles are comprised of Ag, Ni, In, Sn, indium tin oxide, or an alloy thereof.

10. The semiconductor package as claimed in claim 8, wherein said conductive particles are comprised of a metal having an electrical conductivity of $10^{-8}$ Ω/cm.

11. A semiconductor package comprising:
(a) two semiconductor chips, each semiconductor chip having a front surface on which a plurality of bonding pads are formed, and a rear surface opposite the front surface;
(b) an insulating circuit film comprising
   (i) an insulating base film with a plurality of through holes,
   (ii) a plurality of metal lines formed on upper and lower faces of said base film, said metal lines respectively formed on said upper and lower faces being connected with each other via the through holes, wherein said upper and lower faces face said front surface of each corresponding semiconductor chip, and
   (iii) means for electrically connecting each of said metal lines with said bonding pads of the corresponding semiconductor chips;
(c) a plurality of leads electrically connected with said metal lines and extended to connect to an external device wherein said plurality of leads are part of a lead frame, each lead including an inner lead for connecting outer pads to said external device; and
(d) a package body surrounding a predetermined area containing said semiconductor chips, said insulating circuit film and said inner lead of said lead frame,
wherein said means for electrically connecting comprises a plurality of protruded, conductive inner pads which are respectively formed an said metal lines, and an anisotropic conductor comprising a resin and conductive particles contained therein, for electrically connecting said inner pads with said bonding pads through said conductor, wherein said metal lines further comprises a plurality of protruded, conductive outer pads which are respectively formed on said metal lines apart by a selected interval from the plurality of inner pads and connected to said plurality of leads, and wherein said plurality of leads include an outer lead exposed at the lower surface of said package body,
wherein said insulating circuit film, said bonding pads of said semiconductor chips, and said inner leads of said lead frame are electrically connected to one another by means of the anisotropic conductor,
wherein said insulating circuit film is preferably 10–100 $\mu$m in thickness, and said inner and outer pads have a height of 1–20 $\mu$m, and a size of 5 $\mu$m×5 $\mu$m–200 $\mu$m×200 $\mu$m,
wherein said inner lead comprises a metal selected from a group comprising Ag, Sn or In,
wherein said resin is in liquid or solid states, and is selected from a group comprising: epoxy or transformed epoxy resin; polyester or transformed polymer; acrylic ester or transformed ester; silicon resins; phenoxy resins, polyurethane; polysulfide; cyanoacrylates; polyalexins; and a polymer which is hardened by thermal radiation, ultraviolet radiation, or room temperature,
wherein said particles contained in said anisotropic conductor have a size of 3–15 $\mu$m,
wherein said particles are comprised of Ag, Ni, In, Sn, indium tin oxide, or an alloy thereof,
wherein said particles are rectangular, square, triangular, hexahedral, square horn or triangular horn in shape,
wherein said metal lines are comprised of Cu, Ni, Au; Cu, Ni, Cr, Au; or Cu, Ni, Co, Au and are formed with a maximum width of 1 mil, and
wherein said through holes have a diameter of 10–200 $\mu$m.

* * * * *

UNITED STATES PATENT AND TRADEMARK OFFICE
CERTIFICATE OF CORRECTION

PATENT NO : 6,080,931
DATED : June 27, 2000
INVENTOR(S): K. Park et al

It is certified that error appears in the above-identified patent and that said Letters Patent are hereby corrected as shown below:

At col. 11, line 29, prior to "said metal lines", please cancel "an" and substitute --on-- therefor.

Signed and Sealed this

Seventeenth Day of April, 2001

*Attest:*

NICHOLAS P. GODICI

*Attesting Officer*   *Acting Director of the United States Patent and Trademark Office*